United States Patent
Yoshida (10) Patent No.: US 9,073,102 B2
(45) Date of Patent: Jul. 7, 2015

(54) METHOD FOR CLEANSING NANOIMPRINTING MOLDS

(71) Applicant: FUJIFILM Corporation, Minato-ku, Tokyo (JP)

(72) Inventor: Masafumi Yoshida, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 212 days.

(21) Appl. No.: 13/932,126

(22) Filed: Jul. 1, 2013

(65) Prior Publication Data

US 2013/0291890 A1    Nov. 7, 2013

Related U.S. Application Data

(63) Continuation of application No. PCT/JP2012/050645, filed on Jan. 6, 2012.

(30) Foreign Application Priority Data

Jan. 6, 2011    (JP) .................. 2011-001349

(51) Int. Cl.
| | | |
|---|---|---|
| B08B 3/12 | (2006.01) | |
| B29C 33/62 | (2006.01) | |
| B82Y 10/00 | (2011.01) | |
| B82Y 40/00 | (2011.01) | |
| G03F 7/00 | (2006.01) | |
| C11D 11/00 | (2006.01) | |
| G03F 7/30 | (2006.01) | |

(52) U.S. Cl.
CPC .............. *B08B 3/12* (2013.01); *C11D 11/0047* (2013.01); *B29C 33/62* (2013.01); *B82Y 10/00* (2013.01); *B82Y 40/00* (2013.01); *G03F 7/0002* (2013.01); *G03F 7/3014* (2013.01)

(58) Field of Classification Search
CPC ............................ C11D 11/0047; B08B 3/12
See application file for complete search history.

(56) References Cited

U.S. PATENT DOCUMENTS

| | | | |
|---|---|---|---|
| 2008/0202163 A1* | 8/2008 | Okinaka et al. ................. | 65/30.1 |
| 2008/0203620 A1* | 8/2008 | Okinaka et al. ................ | 264/483 |
| 2009/0039563 A1* | 2/2009 | Okinaka et al. ................ | 264/446 |
| 2010/0084376 A1 | 4/2010 | Khusnatdinov et al. | |
| 2010/0092727 A1* | 4/2010 | Uchida ......................... | 428/142 |
| 2010/0109195 A1 | 5/2010 | Xu et al. | |
| 2011/0319516 A1 | 12/2011 | Xu et al. | |

FOREIGN PATENT DOCUMENTS

| | | |
|---|---|---|
| JP | 2002-283354 A | 10/2002 |
| JP | 2004-351693 A | 12/2004 |
| JP | 2005-191444 A | 7/2005 |
| JP | 2009-170773 A | 7/2009 |
| JP | 201055672 A | 3/2010 |
| JP | 2010-076134 A | 4/2010 |
| JP | 2010274460 A | 12/2010 |

OTHER PUBLICATIONS

Communication dated Jul. 1, 2014, issued by the Japan Patent Office in corresponding Japanese Application No. 2011-001349.

* cited by examiner

*Primary Examiner* — Gregory Webb
(74) *Attorney, Agent, or Firm* — Sughrue Mion, PLLC (57) ABSTRACT

A method for cleansing a mold of the present invention suppresses generation of damage is a method for cleansing a nanoimprinting mold, in which a mesa type mold is immersed in cleansing fluid and ultrasonic cleansing is performed in a state in which a mold release layer containing a fluorine compound is provided on a patterned region of the mesa type mold.

14 Claims, 2 Drawing Sheets

METHOD FOR CLEANSING NANOIMPRINTING MOLDS

TECHNICAL FIELD

The present invention is related to a cleansing method for cleansing a nanoimprinting mold having a predetermined pattern of protrusions and recesses on the surface thereof, after mold is employed to perform nanoimprinting.

BACKGROUND ART

There are high expectations regarding utilization of pattern transfer techniques that employ a nanoimprinting method to transfer patterns onto resist coated on objects to be processed, in applications to produce magnetic recording media such as DTM (Discrete Track Media) and BPM (Bit Patterned Media) and semiconductor devices.

The nanoimprinting method is a development of the well known embossing technique employed to produce optical discs. In the nanoimprinting method, a metal original (commonly referred to as a mold, a stamper, or a template), on which a pattern of protrusions and recesses is formed, is pressed against resist coated on an object to be processed. Pressing of the original onto the resist causes the resist to mechanically deform or to flow, to precisely transfer the fine pattern. If a mold is produced once, nano level fine structures can be repeatedly molded in a simple manner. Therefore, the nanoimprinting method is an economical transfer technique that produces very little harmful waste and discharge. Therefore, there are high expectations with regard to application of the nanoimprinting method in various fields.

The conventional nanoimprinting method performs nanoimprinting utilizing a mold, which is a flat substrate on the entire surface of which a pattern of protrusions and recesses is formed, as described in Japanese Unexamined Patent Publication No. 2010-076134. However, in the case that such a mold is employed, problems, such as deterioration in mold release property due to the entirety of the surface on which the pattern of protrusions and recesses is formed coming into close contact with resist, and that the range through which resist flows cannot be controlled due to resist flowing across the entirety of the surface on which the pattern of protrusions and recesses is formed, occur.

Figure 3A:
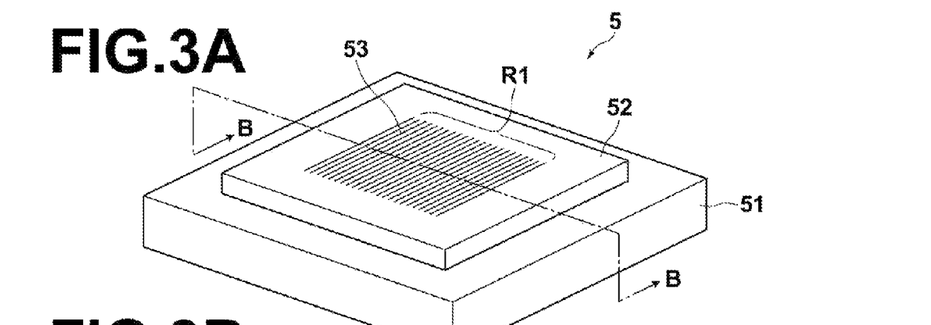
FIG. 3A is a schematic perspective view that illustrates a conventional mesa type mold.
Figure 3B:
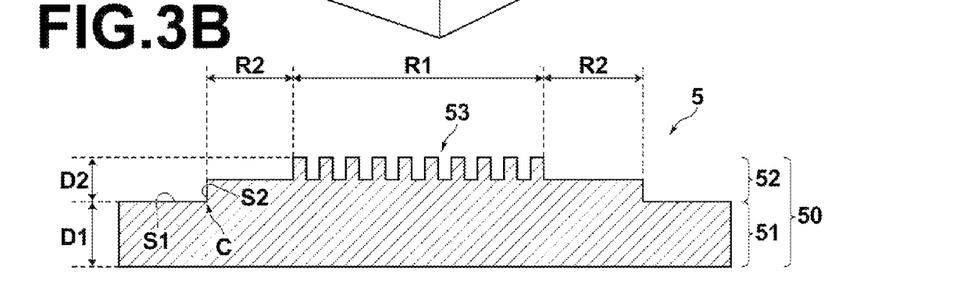
FIG. 3B is a schematic sectional view that illustrates the mold of FIG. 3A, taken along line B-B of FIG. 3A.
Figures 4A, 4C:
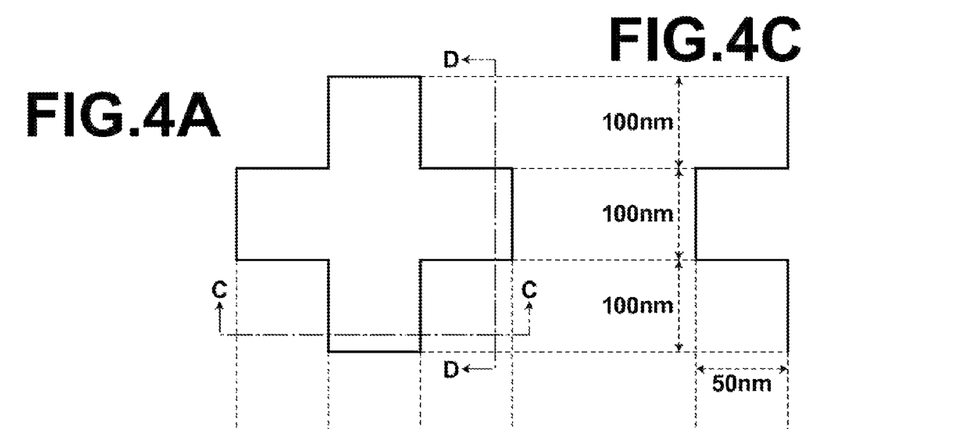
FIG. 4A is a schematic plan view of a cruciform defect preventing pattern according to an embodiment of the present invention.
FIG. 4C is a schematic partial side view that illustrates the end indicated by line D-D of FIG. 4A.
Figure 4B:
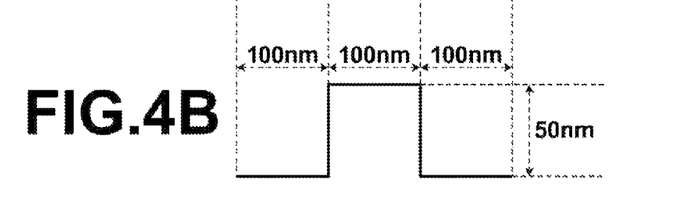
FIG. 4B is a schematic partial side view that illustrates the end indicated by line C-C of FIG. 4A.

Therefore, nanoimprinting utilizing mesa type molds has been being developed in recent years, as described in Japanese Unexamined Patent Publication No. 2009-170773. A mesa type mold refers to a mold 5 having a mesa shaped structure as illustrated in FIG. 3A and FIG. 3B, for example. Specifically, the mold 5 illustrated in FIG. 3A and FIG. 3B is equipped with a planar support portion 51 and a mesa portion 52 provided on a surface S1 (a base surface) of the support portion 51 and having a predetermined height D2 from the base surface S1. A patterned region R1, in which a fine pattern 53 of protrusions and recesses is formed, is provided on the mesa portion 52. In the case that a mesa type mold is utilized, when the mold is pressed against resist which is coated on an object to be processed, the space around the periphery of the mesa portion becomes an escape for the flowing resist, and therefore, the aforementioned problems are resolved.

DISCLOSURE OF THE INVENTION

However, in the mesa type mold 5, the following problems occur in a cleansing process to remove residue of resist which is utilized during nanoimprinting after nanoimprinting is performed.

Generally, nanoimprinting molds are cleansed by immersing them in cleansing fluid then applying ultrasonic waves. However, in the case that ultrasonic cleansing is applied to the mesa type mold 5, forces are concentrated at the corners C formed by the base surface S1 of the support portion 51 and the side surfaces S2 of the mesa portion 52, and there is a possibility that the corners C will become damaged (including mars and defects being generated). The possibility of damage occurring increases as the amount of time of the ultrasonic cleansing operation becomes longer.

The present invention has been developed in view of the foregoing circumstances. It is an object of the present invention to provide a method for cleansing mesa type nanoimprinting molds that suppresses damage to the molds.

A cleansing method of the present invention that solves the aforementioned problem is a cleansing method for cleansing a nanoimprinting mold after the nanoimprinting mold is employed to perform nanoimprinting, characterized by:

the mold being equipped with a planar support portion, a mesa portion formed on a surface of the support portion at a predetermined height from the surface, the mesa portion having a patterned region in which a fine pattern of protrusions and recesses is formed, and a mold release layer containing a fluorine compound formed in the patterned region along the pattern of protrusions and recesses; and the mold is immersed in a cleansing fluid in a state in which residue of resist utilized in nanoimprinting is adhered thereto, and ultrasonic cleansing is performed.

It is preferable for the compositional ratio of fluorine in the compositional ratio of elements that constitute the surface of the mold in the patterned region to be within a range from 10% to 50%.

In the cleansing method for cleansing a nanoimprinting mold of the present invention, it is preferable for the fluorine compound to be a perfluoropolyether.

Here, it is preferable for the perfluoropolyether to be those which are represented by the following Chemical Formula (1), and among these, more preferably to be that which is represented by the following Chemical Formula (2).

Chemical Formula (1):

wherein: Rf represents a perfluoroalkyl group; Z represents a fluorine or a trifluoromethyl group; each of a through e represents an integer 0 or greater; a+b+c+d+e is at least 1; the order of the repetitive units within the parentheses to which a through e are appended may be arbitrary within Chemical Formula (1); and X is a functional group which is capable of chemically bonding with the material of the mesa portion.

Chemical Formula (2):

wherein: p is an integer 1 or greater that represents a degree of polymerization.

Alternatively, the perfluoropolyether may be those which are represented by the following Chemical Formula (3). Among these perfluoropolyether, that which is represented by Chemical Formula (4) is more preferable.

$$P_nR_{m-n}M\text{-}Z\text{—}Y\text{-}G\text{-}(OC_3F_6)_a\text{—}(OC_2F_4)_b\text{—}(OCF_2)_c\text{—}$$
$$O\text{-}G\text{-}Y\text{—}Z\text{-}MP_nR_{m-n} \quad \text{Chemical Formula (3):}$$

wherein: each of a through c represents an integer 0 or greater; a+b+c is at least 1; the order of the repetitive units within the parentheses to which a through c are appended may be arbitrary within Chemical Formula (3); G is a group represented by Chemical Formula (3-1): —(O)$_d$—(CF$_2$)$_e$—(CH$_2$)$_f$— (here, each of d, e, and f represents a integer 0 or greater, the sum of e and f is at least 1, the order of the repetitive units within the parentheses to which d through f are appended may be arbitrary within Chemical Formula (3-1), and d, e, and f do not form a combination in which O is continuous); Y represents a bivalent polar group or a single bond; Z is a group represented by Chemical Formula (3-2): —(CH$_2$)$_g$— (here, g represents an integer 0 or greater); -MP$_n$R$_{m-n}$ represents a functional group which is capable of chemically bonding with the material of the mesa portion; M represents a silicon atom, a titanium atom, or an aluminum atom; P represents a hydroxyl group or a hydrolysable polar group; R represents hydrogen or a hydrocarbon group; m represents an integer having a value one less than the valence of the atom represented by M; n represents an integer within a range from 1 to m; —OC$_3$F$_6$ represents —OCF$_2$CF$_2$CF$_2$— or —OCF(CF)CF$_7$—; and —OC$_2$F$_4$— represents —OCF$_2$CF$_2$— or —OCF(CF$_3$)—.

$$(CH_3O)_3Si\text{—}CH_2CH_2CH_2\text{—}O\text{—}CH_2CF_2\text{—}$$
$$(OCF_2CF_2)_n\text{—}(OCF_2)_k\text{—}OCF_2CH_2\text{—}O\text{—}$$
$$CH_2CH_2CH_2\text{—}Si(OCH_3)_3 \quad \text{Chemical Formula (4):}$$

wherein: j and k represent degrees of polymerization.

In the cleansing method for cleansing a nanoimprinting mold of the present invention, it is preferable for the resist which is utilized to perform nanoimprinting to contain one of isoboronyl acrylate, ethyleneglycol acrylate, a silicone monomer compound, and a fluorine compound.

In the cleansing method for cleansing a nanoimprinting mold of the present invention, it is preferable for the mesa portion to be equipped with a defect preventing pattern for preventing defects in the pattern of protrusions and recesses from being generated during cleansing, at a region other than the patterned region.

In the cleansing method for cleansing a nanoimprinting mold of the present invention, it is preferable for the defect preventing pattern to be of a shape which is employed as an alignment mark.

According to the cleansing method for cleansing nanoimprinting molds of the present invention, the mesa type mold is provided with the mold release layer that contains a fluorine compound on the patterned region. Therefore, the adhesive force that acts between the mold and resist residue can be decreased. Thereby, the amount of resist residue that adheres to the mold can be reduced. Further, even if resist residue adheres to the mold, the resist residue can be easily removed. As a result, the amount of time during which ultrasonic cleansing is performed can be shortened, and damage to the mesa type mold for nanoimprinting can be suppressed.

BEST MODE FOR CARRYING OUT THE INVENTION

Hereinafter, embodiments of the present invention will be described with reference to the attached drawings. However, the present invention is not limited to the embodiments to be described below. Note that the dimensional scale ratios, etc. of the constituent elements within the drawings are not necessarily as the actual scale ratios in order to facilitate visual understanding.

Cleansing Method for Cleansing Molds of the First Embodiment

Figure 1A:
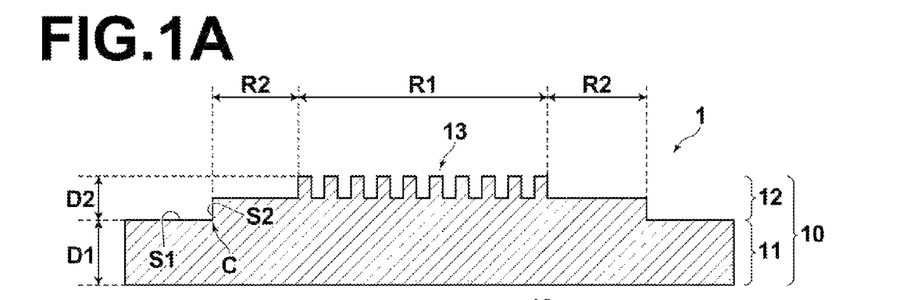
FIG. 1A is a schematic sectional view that illustrates a mesa type mold associated with a cleansing method according to a first embodiment of the present invention.
Figure 1B:
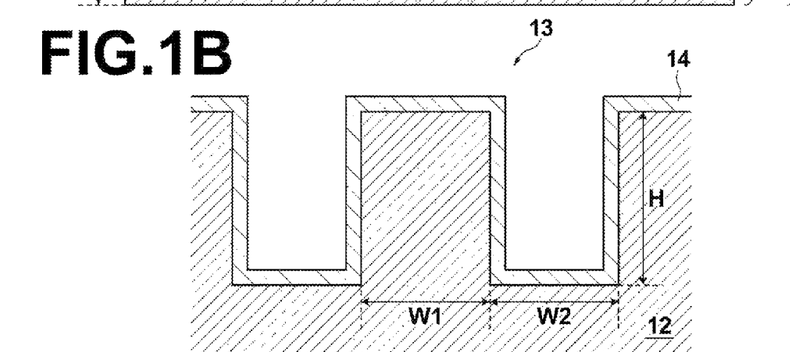
FIG. 1B is a schematic enlarged view that illustrates the cross section of a portion of a patterned region of the mold of FIG. 1A.

A cleansing method for cleansing molds of the first embodiment is that for cleansing a mold 1 having a mesa type substrate 10 and a mold release layer 14, as illustrated in FIG. 1A and FIG. 1B. The mold 1 is immersed in cleansing liquid in a state in which residue of resist utilized for nanoimprinting is adhered thereto, and then ultrasonically cleansed. The mesa type substrate 10 has a planar support portion 11 and a mesa portion 12 formed on a surface S1 (base surface S1) of the support portion 11 at a predetermined height D2 from the base surface S1. The mesa portion 12 has a patterned region R1, in which a fine pattern 13 of protrusions and recesses is formed. In addition, the mold release layer is formed in the patterned region R1 along the pattern 13 of protrusions and recesses, and contains a fluorine compound.

This type of mesa type mold 1 may be produced by administering a mesa process (a process that removes substrate material about the periphery of a mesa portion such that the mesa portion remains) onto a planar substrate. Then, resist may be coated onto the surface of the mesa portion to form a resist film. Thereafter, an electron beam lithography apparatus may be employed to expose a desired pattern on the resist film, and the exposed portion of the resist layer may be removed. Next, etching may be performed using the resist film, which is formed into the desired pattern, as a mask, and the mask may be removed. Finally, the substrate may be exposed to a solution that contains a fluorine compound, to form a mold release layer on the surface of the substrate.

With respect to the mesa type substrate 10, corners C formed between the base surface S1 of the support portion 11 and the side walls S2 of the mesa portion 12 is illustrated as a right angle in FIG. 1A. However, the shapes of the base surface S1 and the side walls S2 are not limited to such a shape. That is, although the degrees of concentration may differ, forces are concentrated at the corners C during ultrasonic cleansing even if the base surface S1 and the side walls S2 are connected continuously and the corners C have radii of curvature. Note that the forces become most concentrated in cases that the corners C are right angles, and therefore the present invention is particularly effective in such cases.

In the mesa type substrate 10, the support portion 11 and the mesa portion 12 are integrally formed, by the planar substrate undergoing the mesa process. The material of the mesa type substrate may be: a metal, such as silicon, nickel, aluminum, chrome, steel, tantalum, and tungsten; oxides, nitrides, and carbides thereof. Specific examples of the material of the mesa type substrate 10 include silicon oxide, aluminum oxide, quartz glass, Pyrex™, glass, and soda glass.

The thickness D1 of the support portion 11 is within a range from 5000 μm to 7000 μm, and preferably within a range from 6000 μm to 6500 μm. The thickness D2 of the mesa portion D2 is within a range from 5 μm to 30 μm, and preferably within a range from 10 μm to 20 μm.

The shape of the pattern 13 of protrusions and recesses is not particularly limited, and may be selected as appropriate according to the intended use of the nanoimprinting mold. An example of a typical pattern is a line and space pattern as illustrated in FIG. 1B. The length of the lines (protrusions), the width W1 of the lines, the distance W2 among the lines, and the height H of the lines from the bottoms of the recesses are set as appropriate in the line and space pattern. For example, the width W1 of the lines is within a range from 10 nm to 100 nm, more preferably within a range from 20 nm to 70 nm, the distance W2 among the lines is within a range from 10 nm to 500 nm, more preferably within a range from 20 nm to 100 nm, and the height H of the lines (the depth of the spaces) is within a range from 10 nm to 500 nm, more preferably within a range from 30 nm to 100 nm. This is because the defect suppressing effect during cleansing of the cleansing method of the present invention becomes more pronounced the finer the pattern of protrusions and recesses is.

The mold release layer 14 is a layer that contains a fluorine compound. Further, it is preferable for the fluorine compound to have a functional group that chemically bonds to the material of the mesa type substrate 10 (that is, the mesa portion 12), from the viewpoint of improving the close contact properties between the mesa type substrate 10 and the mold release layer 14. It is also preferable for the mold release layer 14 to contain a molecular film of the fluorine compound bound to the surface of the mesa type substrate 10 by the functional group.

Further, it is preferable for the fluorine compound to be that having low acidity, and not to be a compound that may damage the substrate, such as hydrogen fluoride, ammonium fluoride, tetramethylammonium fluoride, ammonium hydrogen fluoride, fluoroboric acid, and tetramethylammonium tetrafluoroborate. If the pH of a cleansing liquid composition is less than 0.1, the cleansing power with respect to residual resist that remains on the pattern of protrusions and recesses of the mold. However, such an acidic cleansing liquid etch the material of the cold and/or the oxides on the surface thereof, which generates a problem that the dimensions of the pattern of protrusions and recesses will change from the designed values thereof. Therefore, it is preferable for the pH of the cleaning liquid composition to be greater than 4.

It is preferable for the fluorine compound to be a perfluoropolyether. An example of a perfluoropolyether having a functional group capable of chemically bonding with the material of the mesa type substrate 10 is that represented by the following Chemical Formula (1).

Chemical Formula (1):

In Chemical Formula (1), Rf is not particularly limited as long as it is a perfluoroalkyl group. Examples of perfluoroalkyl groups are those having carbon numbers within a range from 1 to 16. The perfluoroalkyl group may be a straight chain or branched. Preferred examples of the perfluoroalkyl group are: $CF_3$—; $C_2F_5$—; and $C_3F_7$—. Z represents a fluorine or a trifluoromethyl group. Each of a through e represents an integer 0 or greater, and is a repetitive unit number of repetitive units within the parentheses of the perfluoropolyether chain. Here, the value of a+b+c+d+e is at least 1. It is preferable for each of a through e to be within a range from 0 to 200, and more preferably to be within a range from 0 to 50, taking the number average molecular weight of the perfluoropolyether to be described later into consideration. It is preferable for the value of a+b+c+d+e to be within a range from 1 to 100.

The order of the repetitive units within the parentheses, to which a through e are appended, are written in the above order in Chemical Formula (1) for the sake of convenience. However, the order of the repetitive units is not limited to that of Chemical Formula (1), in view of the structure of the perfluoropolyether.

X is a functional group which is capable of chemically bonding with the material of the mesa type substrate 10. The expression "capable of chemically bonding" refers to the functional group chemically reacting with the material of the mesa type substrate 10 when placed in contact with the mesa type substrate 10 at a temperature within a range from room temperature to approximately 200° C., and with added humidity if necessary. Whether the perfluoropolyether is chemically bound can be confirmed by sufficiently cleansing the surface of the mesa type substrate 10 with an agent that dissolves the perfluoropolyether after the above reaction, and then by measuring the contact angle of the surface. The functional group X may be selected according to the material of the mesa type substrate 10. From the viewpoint of reaction properties, preferred examples of the functional group X are: hydrolysable groups that include silicon atoms, titanium atoms, or aluminum atoms; phosphono groups; carboxyl groups; hydroxyl groups; and mercapto groups. Among these, hydrolysable groups that include silicon atoms are preferred. Particularly in the case that X is a hydrolysable group that includes silicon atoms, it is preferable for X to be a group represented by the following Chemical Formula (1-1).

Chemical Formula (1-1):

In Chemical Formula (1-1), Y represents a hydrogen atom or an alkyl group having a carbon number within a range from 1 to 4. The alkyl group having a carbon number within a range from 1 to 4 is not particularly limited, and examples include methyl, ethyl, propyl, and butyl. The alkyl group having a carbon number may be a straight chain or branched. In Chemical Formula (1-1), X' represents a hydrogen atom, a bromine atom, or an iodine atom. In Chemical Formula (1-1), l represents the carbon number of an alkylene group which is present between a carbon within the perfluoropolyether chain and silicon that binds to the carbon. The value of l is 0, 1, or 2, and is preferably 0.

In Chemical Formula (1-1), m represents the number of bonds of a substituent group $R^1$ that bonds with silicon, and has a value of 1, 2, or 3. At portions at which the substituent group $R^1$ is not bound, $R^2$ is bonded to the silicon.

In Chemical Formula (1-1), $R^1$ represents a hydroxyl group or a hydrolysable substituent group. The hydrolysable substituent group is not particularly limited, and preferred examples include: halogen; $-OR^3$; $-OCOR^3$; $-OC(R^3)=C(R^4)_2$; $-ON=C(R^3)_2$; $-ON=CR^5$ (here, $R^3$ represents an aliphatic hydrocarbon group or an aromatic hydrocarbon group, and $R^4$ represents an aliphatic hydrocarbon group having a hydrogen or a carbon number from 1 to 4, and $R^5$ represents a bivalent aliphatic hydrocarbon group having a carbon number from 3 to 6). More preferred examples include: chlorine; $-OCH_3$; and $-OC_2H_5$. Here, $R^2$ represents hydrogen or a monovalent hydrocarbon group. The monovalent hydrocarbon group is not particularly limited, and preferred examples include: methyl; ethyl; propyl; and butyl. The monovalent hydrocarbon may be a straight chain or branched.

In Chemical Formula (1-1), n represents an integer of 1 or greater. Although there is no upper limit to the value of n, it is preferable for n to be an integer within a range from 1 to 10, in order to achieve the objective of the present application. Although in Chemical Formula (1-1), n represents an integer, the perfluoropolyether of the present invention may be present as a component in a polymer mixture represented by Chemical Formula (1) having the integer n therein. In the case that perfluoropolyether is present as a component of a mixture, n may be represented as an average value within the mixture. Considering the objective of the present invention, it is preferable for the average value of n to be within a range from 1.3 to 3, and more preferably within a range from 1.5 to 2.5 in the case that the perfluoropolyether is present as a component of a mixture.

The number average molecular weight of the perfluoropolyether of Chemical Formula (1) is within a range from $5 \cdot 10^2$ to $1 \cdot 10^5$. If the number average molecular weight of the perfluoropolyether is less than $5 \cdot 10^2$, polymer properties are not exhibited and therefore the perfluoropolyether has no utility value. If the number average molecular weight of the perfluoropolyether exceeds $1 \cdot 10^5$, workability deteriorates. Therefore, the number average molecular weight of the perfluoropolyether of Chemical Formula (1) is limited to the above range. A more preferred range of number average molecular weights is from $1 \cdot 10^3$ to $1 \cdot 10^4$.

Taking the above description into consideration, a preferred example of the perfluoropolyether is that represented by Chemical Formula (1-2).

Chemical Formula (1-2):

In Chemical Formula (1-2), p represents an integer of 1 or greater and is not particularly limited, although it is preferable for p to be an integer within a range from 1 to 20. Taking the number average molecular weight of a fluorine polymer that includes silicon of the present invention into consideration, a more preferred range for the value of p is 1 to 50. A commercially available produce may be employed as the perfluoropolyether. In the case that X is a hydrolysable group that includes silicon atoms, such a group may be obtained by employing a commercially available perfluoropolyether as a raw material, introducing iodine into the ends thereof, then causing a vinyl silane compound represented by Chemical Formula (1-3) (in Chemical Formula (1-3), Y, $R^1$, $R^2$, l, and m are the same as those described above) below, for example, to react therewith.

Chemical Formula (1-3):

Further, in the case that the perfluoropolyether is that represented by Chemical Formula (1), it is preferable for the perfluoropolyether to be that represented by Chemical Formula (2) below.

Chemical Formula (2):

In Chemical Formula (2), p represents an integer 1 or greater that represents a degree of polymerization.

Alternatively, the perfluoropolyether may be that represented by Chemical Formula (3) below.

Chemical Formula (3):

In Chemical Formula (3), each of a through c represents an integer 0 or greater, and a+b+c is at least 1. The order of the repetitive units within the parentheses to which a through c are appended may be arbitrary within Chemical Formula (3).

In Chemical Formula (3), G represents a group represented by Chemical Formula (3-1): $-(O)_d-(CF_2)_e-(CH_2)_f-$ (here, each of d, e, and f represents a integer 0 or greater, the sum of e and f is at least 1, the order of the repetitive units within the parentheses to which d through f are appended may be arbitrary within Chemical Formula (3-1), and d, e, and f do not form a combination in which 0 is continuous). Y represents a bivalent polar group or a single bond. Z represents a group represented by Chemical Formula (3-2): —(CH$_2$)$_g$— (here, g represents an integer 0 or greater). -MP$_n$R$_{m-n}$ represents a functional group which is capable of chemically bonding with the material of the mesa type substrate 10. M represents a silicon atom, a titanium atom, or an aluminum atom. P represents a hydroxyl group or a hydrolysable polar group. R represents hydrogen or a hydrocarbon group. m represents an integer having a value one less than the valence of the atom represented by M. n represents an integer within a range from 1 to m. —OC$_3$F$_5$ represents —OCF$_2$CF$_2$CF$_2$— or —OCF(CF$_3$)CF$_2$—. —OC$_2$F$_4$— represents —OCF$_2$CF$_2$— or —OCF(CF$_3$)—.

Further, a, b, and c in Chemical Formula (3) are integers each within a range from 0 to 200. Preferred ranges for a, b, and c are from 1 to 100, considering the number average molecular weight of a polymer including fluorine.

In Chemical Formula (3-1) that represents X of Chemical Formula (3), each of d, e, and f is preferably an integer within a range from 0 to 50. Here, the values of d, e, and f are preferably 0, 1, or 2. More preferably, d=0 or 1, e=2, and f=0 or 1.

Examples of the bivalent polar group represented by Y in Chemical Formula (3) include: —COO—; —OCO—; —CONH—; —NHCO—; —OCH$_2$CH(OH)CH$_2$—; —CH$_2$CH(OH)CH$_2$O—; —COS—; —SCO—; and —O—. Among these, —COO—, —CONH—, —OCH$_2$CH(OH)CH$_2$—, and —CH$_2$CH(OH)CH$_2$O— are preferable.

In Chemical Formula (3-2) that represents Z of Chemical Formula (3), g is an integer within a range from 0 to 50, and preferably 0, 1, 2, or 3.

In Chemical Formula (3), M of the functional group -MP$_n$R$_{m-n}$ represents a metal element belonging to any one of groups 1 through 15 of the periodic table, and is preferably a silicon atom, a titanium atom, or an aluminum atom. Among these, a silicon atom is particularly preferred as M. —SiP$_n$R$_{3-n}$ which is a hydrolysable group that includes a silicon atom is preferred as the functional group -MP$_n$R$_{m-n}$.

The valence number of M in Chemical Formula (3) depends on the properties of the metal atom represented by M, but is generally within a range from 1 to 5, for example, within a range from 2 to 5, and particularly within a range from 3 to 5. For example, in the case that M represents a silicon atom (Si), m=3, and n=1, 2, or 3. However, it is often the case that polymers including fluorine are present as mixtures of polymers represented by Chemical Formula (3) having different values for n. In the case that polymers including fluorine are present as mixtures of polymers, n may be an average value within the mixture.

In Chemical Formula (3), the hydrocarbon group represented by R is preferably a monovalent hydrocarbon group that includes 1 to 5 carbon atoms. Specific examples of such monovalent hydrocarbon groups include alkyl groups such as: —CH$_3$; —C$_2$H$_5$; —C$_3$H$_7$; and —C$_4$H$_9$. The monovalent hydrocarbon group may be a straight chain or branched.

In Chemical Formula (3), the hydrolysable substituent group represented by P is not particularly limited. Preferable examples include: halogen; —OR$^2$; —OCOR$^2$; —OC(R$^2$)═C(R)$_2$; and —ON═CR$^4$ (here, R$^2$ represents an aliphatic hydrocarbon group or an aromatic hydrocarbon group, R$^3$ represents hydrogen or an aliphatic hydrocarbon group having a carbon number from 1 to 4, and R$^4$ represents a bivalent aliphatic hydrocarbon group having a carbon number from 3 to 6). Chlorine, —OCH$_3$, and —OC$_2$H$_5$ are particularly preferred as P.

The number average molecular weight of the perfluoropolyether in Chemical Formula (3) is the same as that in the case of Chemical Formula (1).

In Chemical Formula (3), the perfluoropolyether in which Y is a bivalent polar group is preferably synthesized by causing a compound represented by Chemical Formula (3-3) and a compound represented by Chemical Formula (3-4) to react with each other.

Q-Z-M-P$_n$R$_{m-n}$        Chemical Formula (3-3):

In Chemical Formula (3-3), Z, M, P, R, m, and n are the same as those described above with reference to Chemical Formula (3), and Q represents a polar group.

T-X—(OC$_3$F$_6$)$_a$—(OC$_2$F$_4$)$_b$—(OCF$_2$)$_c$—X-T    Chemical Formula (3-4):

In Chemical Formula (3-4), X, a, b, and c are the same as those described above with reference to Chemical Formula (3), and T represents a polar group.

Y of Chemical Formula (3) is formed, by Q of Chemical Formula (3-3) and T of Chemical Formula (3-4) reacting with each other. That is, polar group Q and polar group T are polar groups capable of forming a bivalent polar group corresponding to Y. Examples of polar group Q include: —COOH; —OH; —NH$_2$; —SH; -Hal (halogen); and a group represented by Chemical Formula (3-5) below.

Chemical Formula (3-5):

Examples of polar group T include: HO—; HOOC—; Hal-CO (acidic halide); H$_2$N; HS—; and a group represented by Chemical Formula (3-6) below.

Chemical Formula (3-6):

The reaction between the polar group Q and the polar group T may be realized as a known type of reaction (for example, a dehydration condensation reaction, an epoxy ring opening reaction, etc.).

Among the perfluoropolyethers represented by Chemical Formula (3), an example of a preferred compound is that represented by Chemical Formula (3-7) below.

P$_n$R$_{m-n}$Si—Z—Y—X—(OC$_3$F$_6$)$_a$—(OC$_2$F$_4$)$_b$—(OCF$_2$)$_c$—O—X—Y—Z—SiP$_n$R$_{m-n}$    Chemical Formula (3-7):

In Chemical Formula (3-7), a, b, c, X, Y, Z, R, and P are the same as those described above with reference to Chemical Formula (3).

Further, in the case that the perfluoropolyether is that represented by Chemical Formula (3), it is preferably that represented by Chemical Formula (4) below.

(CH$_3$O)$_3$Si—CH$_2$CH$_2$CH$_2$—O—CH$_2$CF$_2$—(OCF$_2$CF$_2$)$_j$—(OCF$_2$)$_k$—OCF$_2$CH$_2$—O—CH$_2$CH$_2$CH$_2$—Si(OCH$_3$)$_3$    Chemical Formula (4):

In Chemical Formula (4), j and k are integers 1 or greater that represent degrees of polymerization.

The compound of Chemical Formula (4) may be produced, for example, by employing Fomblin ZDOL by Aujimont (presently Solvay Solexis). Fomblin ZDOL is a compound represented by Chemical Formula (4-1) below.

$$HO-CH_2CF_2-(OCF_2CF_2)_j-(OCF_2)_k-OCF_2CH_2-OH \qquad \text{Chemical Formula (4-1):}$$

In Chemical Formula (4-1), j and k are integers 1 or greater that represent degrees of polymerization. The number average molecular weight of the compound is approximately 2000.

For example, the compound represented by Chemical Formula (4) can be obtained by the following steps. First, NaH (sodium hydride) is caused to react with Fomblin ZDOL represented by Chemical Formula (4-1) to cause the ends of the hydroxyl group to become sodium oxide. Then, aryl bromide is caused to react with the sodium oxide at the ends to arylate the hydroxyl groups at the ends. Thereafter, hydrosilylation is performed on the unsaturated compound using trichlorosilane ($SiHCl_3$). Finally, methanol is employed to substitute chlorine atoms on silicon with methoxy.

It is preferable for the mold release layer 14 to be formed by exposing the mesa type substrate 10 to perfluoropolyether. Thereby, a molecular film, in which the principal chains of the perfluoropolyether are arranged parallel to each other, can be obtained. Specifically, the formation process is performed as follows.

Perfluoropolyether is diluted with a fluorinated inert solvent to a concentration within a range from 0.01% by weight to 10% by weight, preferably a concentration within a range from 0.01% by weight to 1% by weight, and more preferably a concentration within a range from 0.01% by weight to 0.2% by weight. That is, it is preferable for the mold release layer to be formed by immersing the mesa type substrate 10 into such a diluted solution. Examples of the fluorinated inert solvent include: perfluorohexane; perfluoromethylcyclohexane; perfluoro-1,3-dimethylcyclohexane; and dichloropentafluoropropane (HCFC-225). The temperature during immersion is not particularly limited, and may be within a range from 0° C. to 100° C. The amount of time required for immersion varies according to the temperature during immersion. However, generally, 10 minutes or less is favorable, and approximately 1 minute is sufficient.

Alternatively, the mold release layer 14 may be formed by exposing the mesa type substrate 10 to perfluoropolyether vapor under decreased pressure conditions. The pressure in this case is not particularly limited, as long as it is less than 1 atmosphere and 0.1 atmosphere or greater. In order to expose the mesa type substrate 10 to the perfluoropolyether vapor, the mesa type substrate 10 may be left in an environment in which the diluted perfluoropolyether solution is heated and vaporized. Alternatively, the perfluoropolyether vapor may be blown onto the mesa type substrate 10. In this case, the temperature of the vapor may be within a range from 100° C. to 250° C.

The degree of coating of the mold release layer 14 including the scarcity and density of the layer (that is, the degree of bonding of the fluorine compound to the surface of the mesa portion 12) can be set as appropriate by adjusting the amount of time that the mesa type substrate 10 is exposed to the diluted fluorine compound solution or by adjusting the concentration of the diluted solution.

Note that it is necessary to form the mold release layer 14 prior to executing nanoimprinting. That is, nanoimprinting is performed in a state in which the mold release layer 14 is present on the patterned region. Here, the adhesive force that operates between the fluorine compound and resist is weaker than the adhesive force that operates between the material of the mesa type substrate 10 and the resist. Therefore, the amount of residual resist itself when the mold 1 is separated from the resist will decrease. Even in the case that residual resist is attached to the mold 1, it becomes possible to easily remove the residual resist. This is considered to be due to the reduced adhesive force that operates between the mold 1 and the resist, and also because the attached residual reside is enveloped by the fluorine compound, and is removed together therewith.

The mold release layer 14 wears after repeated performance of nanoimprinting operations. Accordingly, in the cleansing method of the mold 1 according to the present invention, it is preferable for the compositional ratio of fluorine in the compositional ratio of elements that constitute the surface of the mold 1 in the patterned region R1 (that is, the surface that includes the mold release layer 14) to be within a range from 10% to 50%, more preferably within a range from 15% to 40%, and most preferably within a range from 20% to 35%. That is, it is preferable for continuous repeated nanoimprinting operations to be ceased and a cleansing operation to be administered in a state in which the compositional ratio of fluorine is within the above range. If the compositional ratio of fluorine exceeds 50%, cleansing effects are reduced due to cleansing liquid bubbling, and if the compositional ratio of fluorine is less than 10%, the cleansing effects are reduced due to increased opportunities for the material that constitutes the mesa type substrate 10 and resist to become directly adhesively attached to each other. The compositional ratio of fluorine can be controlled by adjusting the degree of coating of the mold release layer 14.

Here, the "compositional ratios" of elements that constitute the surface of the mold 1 can be obtained by executing surface analysis using an X ray photoelectron spectrometer (XPS: KRATOS AXIS ULTRA by Shimadzu Corporation) under conditions of X ray source: monotone aluminum gun (monoAl); applied voltage: 12 kV; tube current: 10 mA; lens mode: hybrid; pass energy: 160 eV/40 eV; and energy step: 0.1 eV. The phrase "continuous repeated nanoimprinting operations" refers to executing nanoimprinting operations a plurality of times without cleansing the mold.

Two methods may be considered to cease continuous repeated nanoimprinting operations in a state in which the compositional ratio of fluorine is within the above range may be considered. A first method is for a case in which the number of repetitions of the continuous repeated nanoimprinting operations is set to a predetermined number. In this case, wear of the mold release layer 14 is taken into consideration, and the degree of coating of the mold release layer 14 is controlled such that the compositional ratio of fluorine is within the above range after the predetermined number of repetitions. A second method is to cease continuous repeated nanoimprinting operations to be ceased during a time in which the compositional ratio of fluorine is within the above range, in the case that the degree of coating of the mold release layer 14 is set and determined. Conventionally, it is known to form mold release layers employing organic materials and then to perform nanoimprinting operations. However, the technical concept of ceasing continuous repeated nanoimprinting operations in a state in which the compositional ratio of fluorine is within the above range from the viewpoint of cleansing effects was heretofore unknown.

The cleansing method for molds of the present invention is effective regardless of the type of resist, and particularly effective with respect to resists that include fluorine compounds. For example, bulk materials of resists include: isobornyl acrylate; n-hexyl acrylate; ethylene glycol diacrylate; and a photocuring resist X that includes 2-hydroxy-2-methyl-1-phenyl-propane-1-on. Note that a surfactant may be added as appropriate.

It is preferable for isobornyl acrylate (IBOA) as an acrylate component to constitute approximately 47% by weight of the bulk material, but may be adjusted within a range from 20% by weight to 80% by weight. As a result, the mechanical properties of the resist are mainly borne by IBOA. Sartomer Company, Inc., located in Exton, Pa., is a supplier of IBOA, under the product name SR506.

It is preferable for n-hexyl acrylate (n-HA) to constitute approximately 25% by weight of the bulk material, but may be adjusted within a range from 0% by weight to 50% by weight. In the case that it is desired to impart more pliable properties to the resist, n-HA is utilized to decrease and adjust the viscosity of the resist to be within a range from 2cP to 9cP. Aldrich Chemical Company, located in Milwaukee, Wis., is a supplier of n-HA.

It is preferable for ethylene glycol diacrylate (EGDA), which is a bridging component, to constitute approximately 25% by weight of the bulk material, but may be adjusted within a range from 10% by weight to 50% by weight. EGDA contributes to increased elasticity and rigidity, and further functions to promote bridging between n-HA and IBOA when the bulk material is polymerized.

It is preferable for 2-hydroxy-2-methyl-1-phenyl-propane-1-on, which is a polymerization initiator, to constitute approximately 3% by weight of the bulk material, but may be adjusted within a range from 1% by weight to 5% by weight. The chemical rays that the polymerization initiator is responsive to are wide band ultraviolet rays emitted by a medium pressure mercury lamp. The polymerization initiator facilitates bridging and polymerization of each component of the bulk material. Ciba Specialty Chemicals, located in Tarrytown, N.Y., is a supplier of 2-hydroxy-2-methyl-1-phenyl-propane-1-on, under the product name DAROCUR™ 1173.

A photocuring resist Y, prepared by adding a photopolymerization initiator (approximately 2% by mass) and a fluorine monomer (0.1% by mass to 1% by mass) to a polymerizable compound, may be employed as the resist that includes fluorine. In addition, an oxidization preventing agent (approximately 1% by mass) may also be added as necessary. The photocuring resist Y produced in the above manner can be cured by ultraviolet light having a wavelength of 360 nm.

Examples of the polymerizable compound include: benzyl acrylate (Viscoat #160 by Osaka Organic Chemical Industry Co., LTD.), ethyl carbitol acrylate (Viscoat #190 by Osaka Organic Chemical Industry, Co., LTD.), polypropylene glycol diacrylate (Aronix M-220 by TOAGOSEI Co., LTD.), and trimethylol propane PO denatured triacrylate (Aronix M-310 by TOAGOSEI Co., LTD.). In addition, a compound A represented by Chemical Formula (5) below may also be employed as the polymerizable compound.

Chemical Formula (5):

Examples of the photopolymerization initiating agent include alkyl phenone type photopolymerization initiating agents, such as 2-(dimethyl amino)-2-[(4-methylphenyl)me-thyl]-1-[4-(4-morpholinyl)phenyl]-1-butanone (IRGACURE 379 by Toyotsu Chemiplas K.K.)

In addition, a compound B represented by Chemical Formula (6) below may be employed as the fluorine monomer.

Chemical Formula (6):

As described above, according to the cleansing method for cleansing nanoimprinting molds of the present invention, the mesa type mold is provided with the mold release layer that contains a fluorine compound on the patterned region. Therefore, the adhesive force that acts between the mold and resist residue can be decreased. Thereby, the amount of resist residue that adheres to the mold can be reduced. Further, even if resist residue adheres to the mold, the resist residue can be easily removed. As a result, the amount of time during which ultrasonic cleansing is performed can be shortened, and damage to the mesa type mold for nanoimprinting can be suppressed.

Cleansing Method for Cleansing Molds of the Second Embodiment

The cleansing method for cleansing molds according to a second embodiment will be described. The cleansing method for molds of the second embodiment is substantially the same as the cleansing method for molds of the first embodiment. However, the cleansing method for molds of the second embodiment differs from the cleansing method for molds of the first embodiment in that the mesa portion has a defect preventing pattern in a region other than the patterned region thereof. Accordingly, detailed descriptions of constitutive elements other than the defect preventing pattern which are the same as those of the method for cleansing molds of the first embodiment will be omitted insofar as they are not particularly necessary.

Figure 2A:
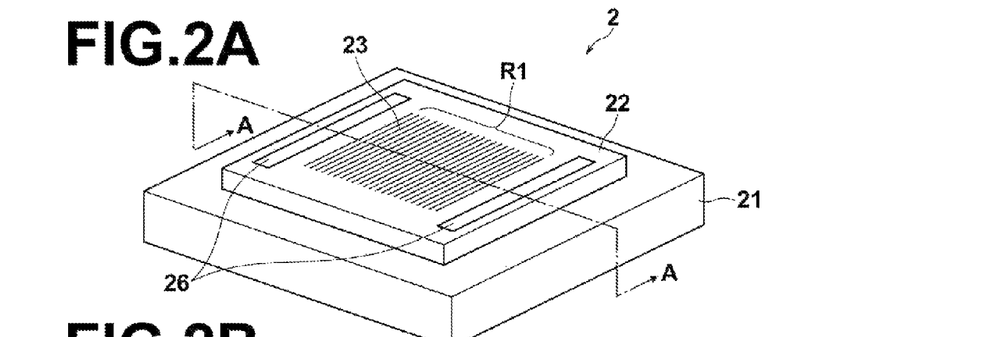
FIG. 2A is a schematic perspective view that illustrates a mesa type mold associated with a cleansing method according to a second embodiment of the present invention.
Figure 2B:
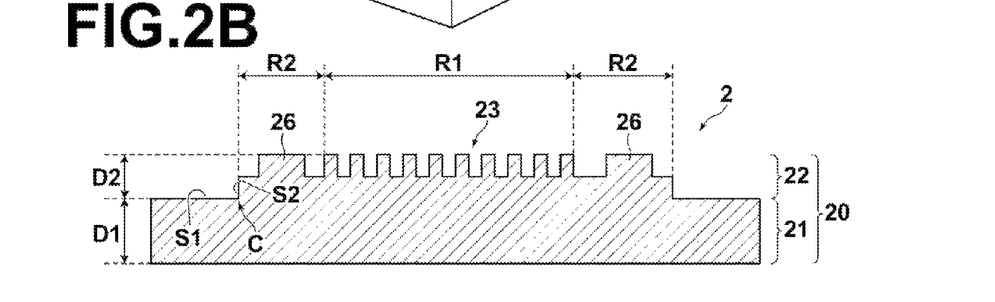
FIG. 2B is a schematic sectional view that illustrates the mold of FIG. 2A, taken along line A-A of FIG. 2A.

FIG. 2A is a schematic perspective view that illustrates a mesa type mold 2 associated with the cleansing method according to the second embodiment of the present invention. FIG. 2B is a schematic sectional view that illustrates the mold of FIG. 2A, taken along line A-A of FIG. 2A.

In the cleansing method of the second embodiment, the mold 2 has a mesa type substrate 20 and a mold release layer, is immersed in cleansing liquid in a state in which residue of resist utilized for nanoimprinting is adhered thereto, and then ultrasonically cleansed. The mesa type substrate 20 has a planar support portion 21 and a mesa portion 22 formed on a surface S1 (base surface S1) of the support portion 21 at a predetermined height D2 from the base surface S1. The mesa portion 22 has a patterned region R1, in which a fine pattern 23 of protrusions and recesses is formed, and a defect preventing pattern 26 in a region R2 of the mesa portion 22 other than the patterned region R1. The mold release layer (not shown) is the same as that of the first embodiment.

As illustrated in FIG. 2A and FIG. 2B, the defect preventing pattern 26 is formed in the vicinity of the pattern 23 of protrusions and recesses. The defect preventing pattern 26 does not contribute to pattern formation which is the purpose of nanoimprinting, but prevents defects from being generated in the pattern 23 of protrusions and recesses during cleansing operations. Defects in the pattern 23 of protrusions and recesses generated during ultrasonic cleansing are suppressed by the defect preventing pattern receiving and lightening the impact of ultrasonic waves in a horizontal direction with respect to the pattern 23 of protrusions and recesses (a direction perpendicular to the side surfaces of the lines of the pattern 23 of protrusions and recesses; that is, the horizontal direction in FIG. 2B).

The mesa type substrate 20 differs from the mesa type substrate of the first embodiment in that the defect preventing pattern 26 is provided thereon. The defect preventing pattern 26 is formed simultaneously with formation of the pattern 23 of protrusions and recesses, by including a pattern corresponding to the defect preventing pattern 26 into the exposure pattern in addition to a pattern corresponding to the pattern 23 of protrusions and recesses during exposure of the resist film to form the pattern 23 of protrusions and recesses on the mesa portion 22.

The shape of the defect preventing pattern 26 in plan view is not particularly limited, and may be lines or an annular shape that surrounds the pattern 23 of protrusions and recesses. Further, the shape of the defect preventing pattern 26 in plan view may be that in which one or more marks which may be utilized as alignment marks, such as a cruciform shape, are arranged. Meanwhile, it is preferable for the shape of the defect preventing pattern in the cross section perpendicular to the length direction thereof (a cross section parallel to the drawing sheet of FIG. 2B) to be tapered to become smaller at the end thereof. In this case, the impact of ultrasonic waves from the horizontal direction during ultrasonic cleansing can be caused to flow over the defect preventing pattern 26, thereby lightening the impact received by the defect preventing pattern 26 itself. In addition, it is preferable for the shape of the defect preventing pattern in the cross section perpendicular to the length direction thereof to be horizontally symmetrical. In this case, if a focusing movement range of a focusing lens is between the top and the bottom of a step of the alignment mark, points at which changes in brightness profiles become maximal and minimal can be detected, and the center position of the alignment mark can be measured therefrom.

In the case that the defect preventing pattern 26 is formed as lines, defects become less likely to occur in the defect preventing pattern 26 in the case that the line width of the defect preventing pattern is great, or in the case that the aspect ratio (height/line width) of the defect preventing pattern is low. Accordingly, it is preferable for the line width of the defect preventing pattern 26 to be 200 nm or greater. Meanwhile, it is preferable for the line width of the defect preventing pattern 26 to be 1 cm or less, and particularly 1 mm or less. If the line width of the defect preventing pattern 26 is too small, there is a possibility that the defects will be generated in the defect preventing pattern during cleansing, resulting in insufficient protection of the pattern 23 of protrusions and recesses. If the line width of the defect preventing pattern 26 is too large, there is a possibility that the degree of freedom in the design of the pattern 23 of protrusions and recesses will decrease. It is preferable for the aspect ratio (height/line width) of the defect preventing pattern 26 to be 0.5 or less, for example. Meanwhile, it is preferable for the aspect ratio of the defect preventing pattern to be $10^{-5}$ or greater, and particularly $10^{-4}$ or greater. This is because defects being generated in the defect preventing pattern 26 can be further effectively suppressed within this range. It is preferable for the defect preventing pattern 26 to be formed in a linear shape along the lines of the pattern 23 of protrusions and recesses.

Regardless of whether the shape of the defect preventing pattern 26 is linear, defects will become less likely to occur in the defect preventing pattern 26 as the height thereof is lower. It is preferable for the height of the defect preventing pattern 26 of the present invention to be the same as or greater than the height of the lines of the pattern 23 of protrusions and recesses. Adopting this configuration will enable defects being generated in the pattern 23 of protrusions and recesses to be suppressed more effectively. It is preferable for the height of the defect preventing patter 26 to be within a range from 30 nm to 1000 nm, more preferably within a range from 40 nm to 500 nm, and most preferably within a range from 50 nm to 200 nm.

The distance between the side surface of the defect preventing pattern 26 and the side surface of the line of the pattern 23 of protrusions and recesses closest thereto is not particularly limited as long as the distance is that which enables suppression of defects being generated in the pattern 23 of protrusions and recesses during cleansing operations. It is preferable for this distance to be within a range from 10 nm to 100 μm, and more preferably within a range between 22 nm and 1 μm. If the distance between the side surfaces is too short, there is a possibility that desired pattern transfer will become difficult, and if the distance between the side surfaces is too great, there is a possibility that defects being formed in the pattern 23 of protrusions and recesses will not be sufficiently suppressed.

As described above, in the cleansing method for nanoimprinting molds of the second embodiment as well, the mesa type mold is equipped with the mold release layer that includes a fluorine compound on the patterned region. Therefore, the same advantageous effects as those obtained by the first embodiment can be obtained.

Further, in the cleansing method for nanoimprinting molds of the second embodiment, the mold, which has the defect preventing pattern for preventing defects from being generated in the pattern of protrusions and recesses during cleansing provided in a region of the mesa portion other than the patterned region, is employed. Therefore, damage to the mold can be directly suppressed during cleansing of the nanoimprinting mesa type mold.

EXAMPLES

Examples of the cleansing method for molds of the present invention will be described below.

Example 1

Production of the Mesa Type Substrate

A Cr film having a film thickness of 15 nm was formed on a substrate formed by quartz glass 6025 by Asahi Glass Co., LTD. (hereinafter, referred to as Qz), which has undergone mesa processing, by the sputtering method. Electron beam resist ZEP520A by Zeon Corporation was coated on the Cr film, to form a resist film having a film thickness of 100 nm. Thereafter, the substrate underwent exposure lithography by an electron beam lithography apparatus and developed by a developing apparatus, to form a desired pattern on the resist film. A Cr dry etching apparatus was employed to etch the exposed portions of the Cr film within the desired pattern, and further, the exposed portions of the Qz were also etched 200 nm by a Qz dry etching apparatus. A mesa type substrate having a line and space pattern having 500 fine lines (line length: 1 μm, line width: 50 nm, line height: 200 nm, line aspect ratio: 4, and intervals among lines: 50 nm) was obtained by the above steps.

<Formation of the Mold Release Layer>

The mesa type substrate produced as described as above was prepared, and the surface thereof was ultrasonically cleansed with an organic solvent (acetone). Further, the mesa type substrate was cleansed by being boiled in a sulfuric acid/hydrogen peroxide mixture, rinsed with water then dried. Thereafter, the surface was cleaned by undergoing a UV ozone treatment. Next, the mesa type substrate was immersed for 1 minute in a diluted solution containing perfluoropolyether at a concentration of 0.1% by weight at 23° C. A perfluoropolyether represented by $C_3F_7(OCF_2CF_2CF_2)_p OC_2F_4C_2H_4$—$Si(OCH_3)_3$ (number average molecular weight: 4000) was employed as the fluorine compound in the mold release layer, and a fluorine inert solvent (perfluorohexane) was employed as the diluting solvent. After the immersion, the mesa type substrate was rinsed with a fluorine inert solvent (perfluorohexane) for 5 to 20 minutes, then left for approximately one hour in a constant temperature constant humidity tank at 60° C. and 95% humidity. Thereafter, the mesa type substrate was again rinsed with a fluorine inert solvent (perfluorohexane) for 5 minutes, then cleansed with ethyl alcohol. A mold equipped with a mold release layer with a self assembling film having a chemical structure $C_3F_7 (OCF_2CF_2CF_2)_p OC_2F_4C_2H_4$— as a perfluoropolyether molecular film was obtained by the steps described above. Note that the series of processes was performed in the atmosphere.

The compositional ratio of fluorine in the surface of the mold obtained as described above was 35%.

<Preparation of Resist>

The aforementioned resist X was prepared as the resist to be utilized in nanoimprinting. The specific components of the resist X are as follows.

Resist X:
Isobornyl acrylate (47% by weight of the entire weight of bulk materials)
n-hexyl acrylate (25% by weight of the entire weight of bulk materials)
Ethylene glycol diacrylate (25% by weight of the entire weight of bulk materials)
2-hydroxy-2-methyl-1-phenyl-propane-1-on (3% by weight of the entire weight of bulk materials)
ZONYL™ (fluorine surfactant, less than 1% by weight of the entire weight of bulk materials)<

<Nanoimprinting Employing the Mold>

First, the resist X was coated onto a silicon substrate by the spin coat method, to form a resist film. Next, the silicon substrate and the resist film were heated to the glass transition temperature or greater of the resist X. The mold obtained as described above (the mesa type substrate on which the mold release layer was formed) was pressed against the resist film at a pressure of 60 MPa and a temperature of 170° C. Then, the resist film was cured with ultraviolet rays, and the mold was separated.

Example 2

A mold was produced by the same steps as those described with respect to Example 1 except that the concentration of perfluoropolyether in the diluted solution containing perfluoropolyether and/or the immersion time of the mold in the diluted solution was adjusted such that the compositional ratio of fluorine in the surface of the mold became 25%. Nanoimprinting employing the mold was executed in the same manner as in Example 1.

Example 3

A mold was produced by the same steps as those described with respect to Example 1 except that the concentration of perfluoropolyether in the diluted solution containing perfluoropolyether and/or the immersion time of the mold in the diluted solution was adjusted such that the compositional ratio of fluorine in the surface of the mold became 20%. Nanoimprinting employing the mold was executed in the same manner as in Example 1.

Example 4

A mold was produced by the same steps as those described with respect to Example 1. Nanoimprinting employing the mold was executed in the same manner as in Example 1, except that aforementioned resist Y was utilized as the resist for nanoimprinting. The specific components of the resist Y are as follows.

Resist Y:
Compound A (97% by weight of the entire weight of bulk materials)
IRGACURE™ 379 (2% by weight of the entire weight of bulk materials)
Compound B (1% by weight of the entire weight of bulk materials)

Example 5

A mold was produced in the same manner as in Example 1, except that a pattern corresponding to a defect preventing pattern was included when forming a desired pattern on a resist film, by administering exposure lithography on a substrate by an electron beam lithography apparatus and development by a developing apparatus. Thereby, a mold having a linear defect preventing pattern such as those illustrated in FIG. 2A and FIG. 2B was obtained. The length, the width, and height of the lines of the defect preventing pattern are 1 μm, 1 μm, and 200 nm, respectively. The distance between the side surfaces of the lines of the defect preventing pattern and the side surface of the lines of the pattern of protrusions and recesses was 50 nm. Nanoimprinting employing the mold was executed in the same manner as in Example 1.

Example 6

A mold having cruciform defect preventing patterns was obtained by steps similar to those described with reference to Example 5. Specifically, the cruciform defect preventing pattern is of a shape in which two protrusions having lengths of 300 nm and widths of 100 nm intersect perpendicularly at the centers (points at lengths of 150 nm and widths of 50 nm) thereof. These patterns function as the aforementioned alignment marks. Each one of a total of four alignment marks is provided at a position separated from the four corners of the pattern of protrusions and recesses by 50 nm in the vertical direction (the direction of the lines of the pattern of protrusions and recesses) and 50 nm in the horizontal direction (the width direction of the lines of the pattern of protrusions and recesses) such that they are farthest away from the pattern of protrusions and recesses.

Comparative Example 1

A mold was produced by the same steps as those described with reference to Example 1, except that the mold release layer formation step was not executed. Nanoimprinting employing the mold was performed in the same manner as in Example 1.

[Cleansing Test]

An ultrasonic cleansing test was performed on each of the molds of Examples 1 through 6 and Comparative Example 1 after performing nanoimprinting therewith. The cleansing conditions were as follows.

<Cleansing Conditions>

Ultrasonic Apparatus: Ultrasonic Cleansing Apparatus 28101 by Kaijo Corporation
Ultrasonic Waves: 1 MHz Frequency, 30 W Output
Amount of Utilized Water: 1 L/min
Rotating Speed of Substrate: 150 rpm
Cleansing Time: An amount of time until residual resist could not be detected by a scanning electron microscope (SEM)

[Evaluations]

The configurations of the molds, the type of resist, and the results of the cleansing test for each of Examples 1 through 6 and Comparative Example 1 are indicated in Table 1. As a result, it was confirmed that the amount of time required to cleanse molds can be shortened, by executing the cleansing method for molds of the present application.

TABLE 1

| | Mold Release Layer | Compositional Ratio of Fluorine in Patterned Region (%) | Resist Type | Defect Preventing Pattern | Cleansing Time (sec) |
|---|---|---|---|---|---|
| Example 1 | YES | 35 | Resist X | None | 160 |
| Example 2 | | 25 | | | 140 |
| Example 3 | | 20 | | | 150 |
| Example 4 | | 35 | Resist Y | | 160 |
| Example 5 | | | Resist X | Linear | 140 |
| Example 6 | | | | Cruciform | 130 |
| Comparative Example 1 | NO | 0 | | None | 300 |

What is claimed is:

1. A cleansing method for cleansing a nanoimprinting mold after the nanoimprinting mold is employed to perform nanoimprinting, comprising:
    immersing the nanoimprinting mold in a cleansing fluid in a state in which residue of resist utilizing in nonimprinting is adhered thereto; and
    performing ultrasonic cleansing; wherein:
    the mold is equipped with a planar support portion, a mesa portion formed on a surface of the support portion at a predetermined height from the surface, the mesa portion having a patterned region in which a fine pattern of protrusions and recesses is formed, and a mold release layer containing a fluorine compound formed in the patterned region along the pattern of protrusions and recesses.

2. A cleansing method for cleansing a nanoimprinting mold as defined in claim 1, wherein:
    the compositional ratio of fluorine in the compositional ratio of elements that constitute the surface of the mold in the patterned region is within a range from 10% to 50%.

3. A cleansing method for cleansing a nanoimprinting mold as defined in claim 1, wherein:
    the fluorine compound is perfluoropolyether.

4. A cleansing method for cleansing a nanoimprinting mold as defined in claim 3, wherein:
    the perfluoropolyether is that which is represented by the following Chemical Formula (1)

Chemical Formula (1):

wherein: Rf represents a perfluoroalkyl group; Z represents a fluorine or a trifluoromethyl group; each of a through e represents an integer 0 or greater; a+b+c+d+e is at least 1; the order of the repetitive units within the parentheses to which a through e are appended may be arbitrary within Chemical Formula (1); and X is a functional group which is capable of chemically bonding with the material of the mesa portion.

5. A cleansing method for cleansing a nanoimprinting mold as defined in claim 4, characterized by:
    the perfluoropolyether being that which is represented by the following Chemical Formula (2)

Chemical Formula (2):

wherein: p is an integer 1 or greater that represents a degree of polymerization.

6. A cleansing method for cleansing a nanoimprinting mold as defined in claim 3, wherein:
    the perfluoropolyether is that which is represented by the following Chemical Formula (3)

Chemical Formula (3):

wherein: each of a through c represents an integer 0 or greater; a+b+c is at least 1; the order of the repetitive units within the parentheses to which a through c are appended may be arbitrary within Chemical Formula (3); G is a group represented by Chemical Formula (3-1): $-(O)_d-(CF_2)_e-(CH_2)_f-$ (here, each of d, e, and f represents a integer 0 or greater, the sum of e and f is at least 1, the order of the repetitive units within the parentheses to which d, e, and f are appended may be arbitrary within Chemical Formula (3-1), and d, e, and f do not form a combination in which 0 is continuous); Y represents a bivalent polar group or a single bond; Z is a group represented by Chemical Formula (3-2): $-(CH_2)_g-$ (here, g represents an integer 0 or greater); $-MP_nR_{m-n}$ represents a functional group which is capable of chemically bonding with the material of the mesa portion; M represents a silicon atom, a titanium atom, or an aluminum atom; P represents a hydroxyl group or a hydrolysable polar group; R represents hydrogen or a hydrocarbon group; m represents an integer having a value one less than the valence of the atom represented by M; n represents an integer within a range from 1 to m; $-OC_3F_6$ represents $-OCF_2CF_2CF_2-$ or $-OCF(CF_3)CF_2-$; and $-OC_2F_4-$ represents $-OCF_2CF_2-$ or $-OCF(CF_3)-$.

7. A cleansing method for cleansing a nanoimprinting mold as defined in claim 6, wherein the perfluoropolyether is that which is represented by Chemical Formula (4)

Chemical Formula (4):

wherein: j and k are integers 1 or greater that represent degrees of polymerization.

8. A cleansing method for cleansing a nanoimprinting mold as defined in claim 1, wherein:
the resist which is utilized to perform nanoimprinting contains one of isoboronyl acrylate, ethyleneglycol diacrylate, a silicone monomer compound, and a fluorine compound.

9. A cleansing method for cleansing a nanoimprinting mold as defined in claim 1, wherein:
the mesa portion is equipped with a defect preventing pattern for preventing defects in the pattern of protrusions and recesses from being generated during cleansing, at a region other than the patterned region.

10. A cleansing method for cleansing a nanoimprinting mold as defined in claim 2, wherein:
the mesa portion is equipped with a defect preventing pattern for preventing defects in the pattern of protrusions and recesses from being generated during cleansing, at a region other than the patterned region.

11. A cleansing method for cleansing a nanoimprinting mold as defined in claim 3, wherein:
the mesa portion is equipped with a defect preventing pattern for preventing defects in the pattern of protrusions and recesses from being generated during cleansing, at a region other than the patterned region.

12. A cleansing method for cleansing a nanoimprinting mold as defined in claim 9, wherein:
the defect preventing pattern is of a shape which is employed as an alignment mark.

13. A cleansing method for cleansing a nanoimprinting mold as defined in claim 10, wherein:
the defect preventing pattern is of a shape which is employed as an alignment mark.

14. A cleansing method for cleansing a nanoimprinting mold as defined in claim 11, wherein:
the defect preventing pattern is of a shape which is employed as an alignment mark.

* * * * *